United States Patent [19]
Liu

[11] Patent Number: 6,115,925
[45] Date of Patent: Sep. 12, 2000

[54] PROBEPIN-ADJUSTING JIG

[75] Inventor: Clark Liu, Hsin-Chu, Taiwan

[73] Assignee: Powerchip Semiconductor Corp., Hsin-Chu, Taiwan

[21] Appl. No.: 09/071,082

[22] Filed: May 1, 1998

[51] Int. Cl.[7] .................................................. G01C 25/00
[52] U.S. Cl. ................................................. 33/1 M; 33/502
[58] Field of Search ...................... 33/1 M, 502; 73/1.79; 324/758

[56] References Cited

U.S. PATENT DOCUMENTS

| | | | |
|---|---|---|---|
| 4,910,446 | 3/1990 | McMurtry et al. | 33/1 M |
| 4,953,306 | 9/1990 | Weckenmann et al. | 33/1 M |
| 5,909,940 | 6/1999 | Baldock | 33/608 |

*Primary Examiner*—Andrew H. Hirshfeld
*Attorney, Agent, or Firm*—Ladas & Parry

[57] ABSTRACT

A probepin-adjusting jig for adjusting probepins of a probecard. The probepin-adjusting jig includes a base, a first slider, a second slider and a needle. The first slider sits on the base to move in a first direction. The second slider sits on the first slider to move in a second direction. The needle is mounted in the second slider to adjust the probepins of the probecard.

9 Claims, 6 Drawing Sheets

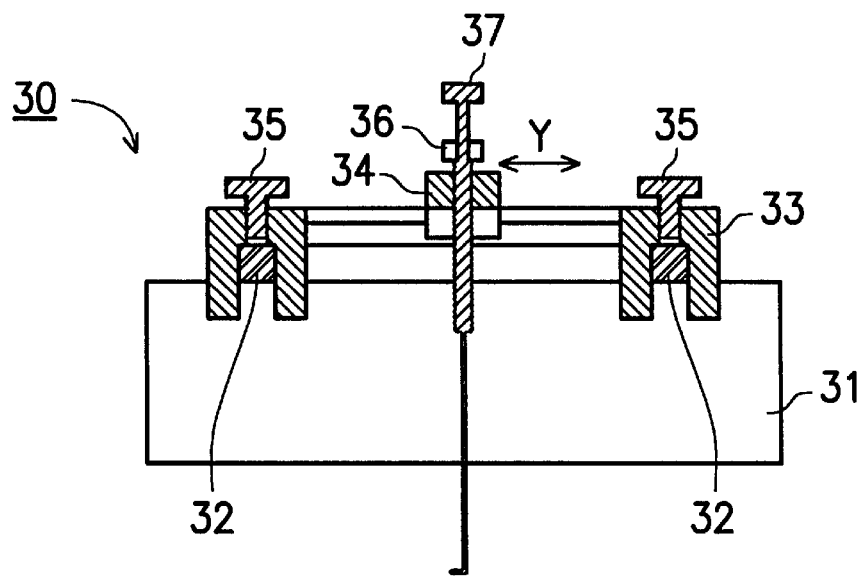
FIG. 7 (SECTION VII)
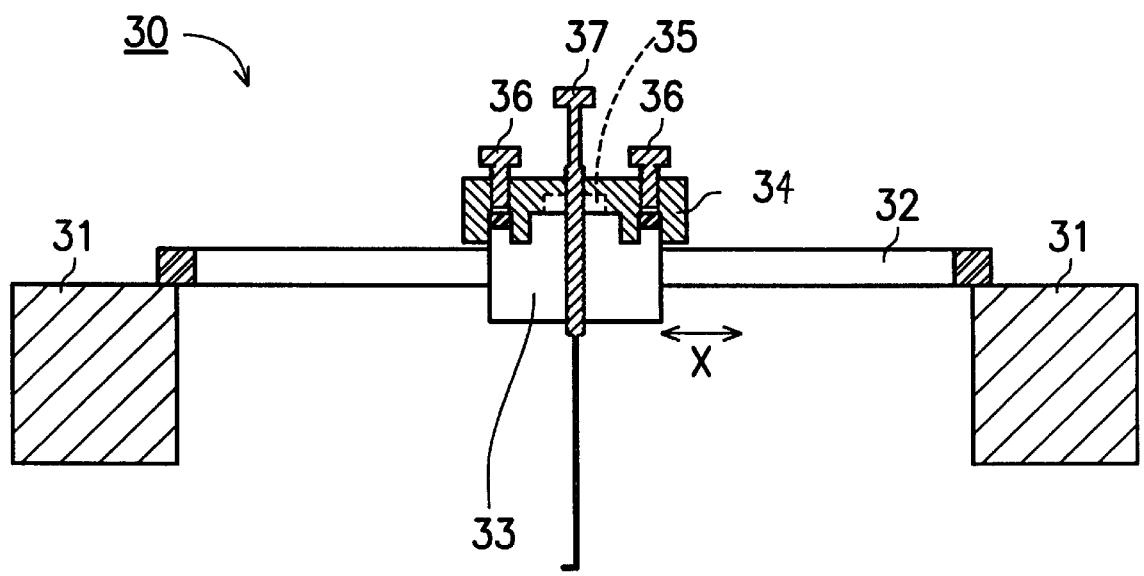
FIG. 8 (SECTION VIII)

PROBEPIN-ADJUSTING JIG

BACKGROUND OF THE INVENTION

1. Field of the Invention

The present invention relates in general to a probepin-adjusting jig by which the technicians can accurately adjust probepins of a probecard.

2. Description of the Related Art

As shown in FIG. 1, a conventional prober for testing DRAM mainly comprises a tester 11, a test head 12 and a probecard 20. The probecard 20 is provided with a plurality of downward probepins 202. Also, the test head 12 is provided with a plurality of contact pins 121 which are electrically connected to the tester 11 and the probepins 202 of the probecard 20.

A wafer 14 is held on a chuck 15 to be tested by the prober. As shown in FIGS. 2 and 3, a rectangular window 201 is provided on the probe card 20 so that four of the chips on the wafer 14 can be simultaneously observed through the window 201. Referring back to FIG. 1, the tester 11 can emit test signals to the test head 12 so as to test the wafer 14 and receive echo signals from the wafer 14 via the test head 12.

If the probepins 202 of the probecard 20 need to be adjusted, the technicians use pushing needles or hooking needles to do it. However, such maintenance is becoming increasingly difficult as the density of the probepins rises. The required accuracy of the adjustment is generally in units of $\mu$m. Accordingly, the technicians cannot avoid disrupting the probepin adjustment through involuntary hand shaking while adjusting the probepins. This problem has not received much attention.

SUMMARY OF THE INVENTION

An object of the present invention is to provide an adjustment jig by which the technicians can accurately adjust the probepins of a probecard.

In accordance with the object of the present invention, there is provided a probepin-adjusting jig for adjusting probepins of a probecard. The probepin-adjusting jig includes a base, a first slider, a second slider and a needle. The base is disposed on the probecard. The first slider sits on the base to move in an X-direction, and the second slider sits on the first slider to move in a Y-direction. It will be understood by those of ordinary skill in the art that the X-direction is not necessarily perpendicular to the Y-direction. The needle can be a hooking needle or a pushing needle, either of which is threaded in the second slider to adjust the probepins of the probecard.

Alternatively, the probepin-adjusting jig further comprises first positioning screws and second positioning screws. The first positioning screws are threaded in the first slider to position the first slider on the base after the first slider is moved to a first desired position. The second positioning screws are threaded in the second slider to position the second slider on the first slider after the second slider is moved to a second desired position.

The probepin-adjusting jig of this invention can prevent the technicians from erroneously disrupting probepin adjustment through involuntary hand shaking, and therefore provides a simple, accurate probepin adjustment.

BRIEF DESCRIPTION OF THE DRAWINGS

The present invention can be more fully understood by reading the subsequent detailed description and examples with references made to the accompanying drawings, wherein:

FIG. 7 is a sectional diagram of FIG. 4 along line VII—VII, before the sliders of the probepin-adjusting jig are positioned;

FIG. 8 is a sectional diagram of FIG. 4 along line VIII—VIII, before the sliders of the probepin-adjusting jig are positioned;

DETAILED DESCRIPTION OF THE PREFERRED EMBODIMENT

Figure 1:
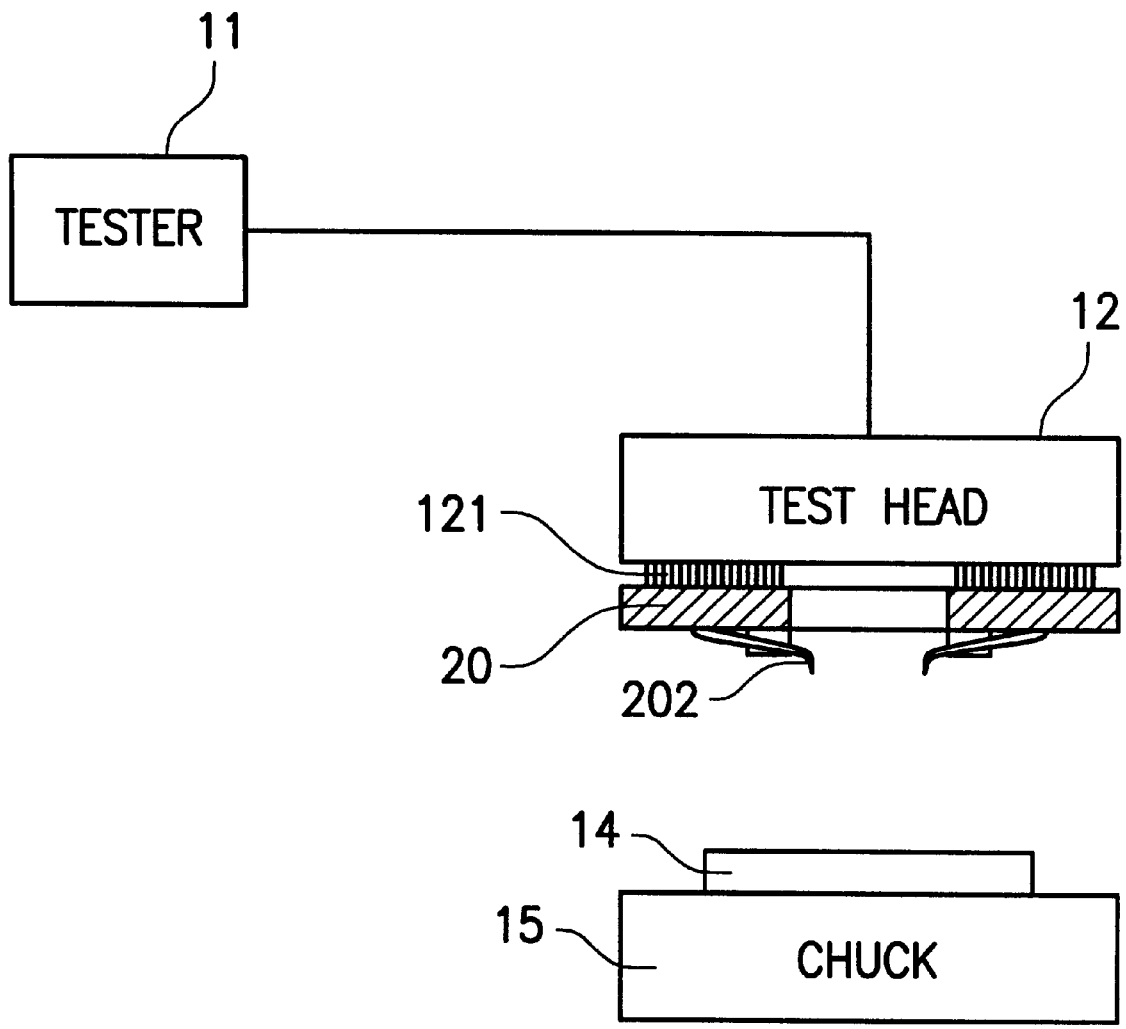
FIG. 1 is a schematic block diagram of a prior art probing test equipment.
Figure 2:
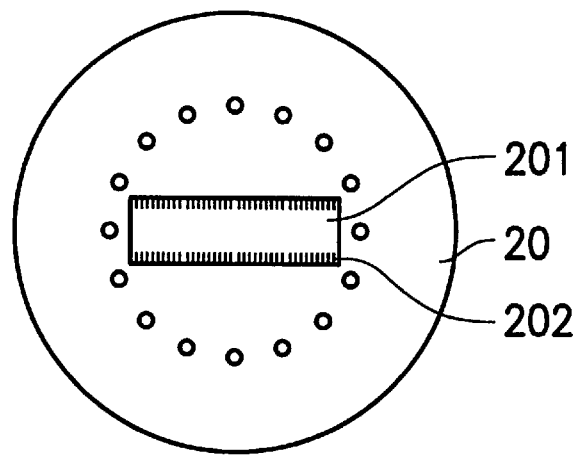
FIG. 2 is a top view of a probecard of the probing test equipment according to FIG. 1.
Figure 3:
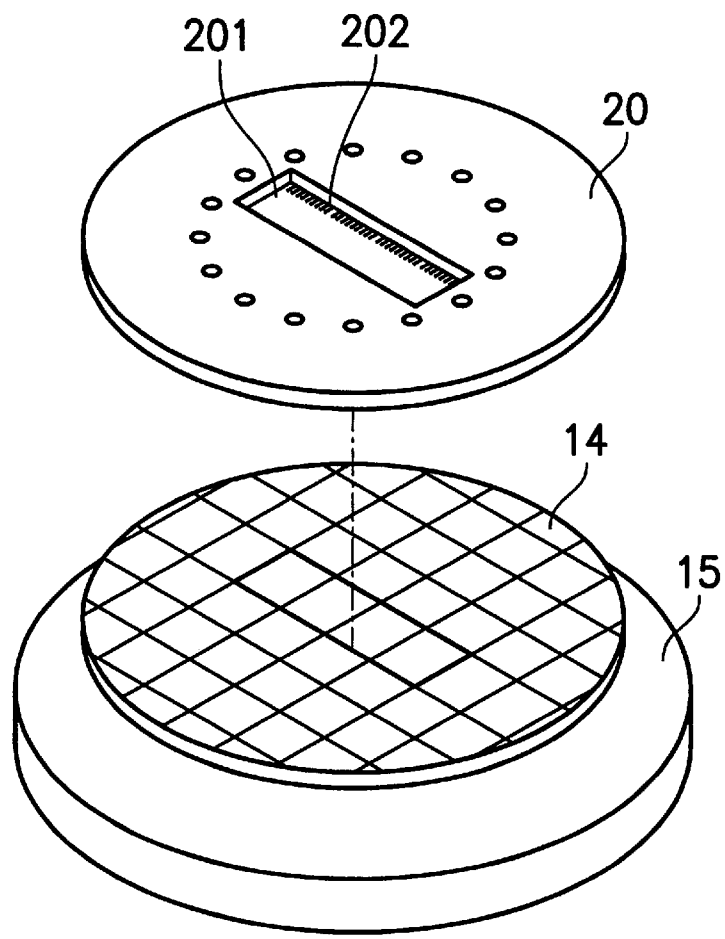
FIG. 3 is a perspective diagram of a probecard, wafer and chuck according to FIG. 1.
Figure 4:
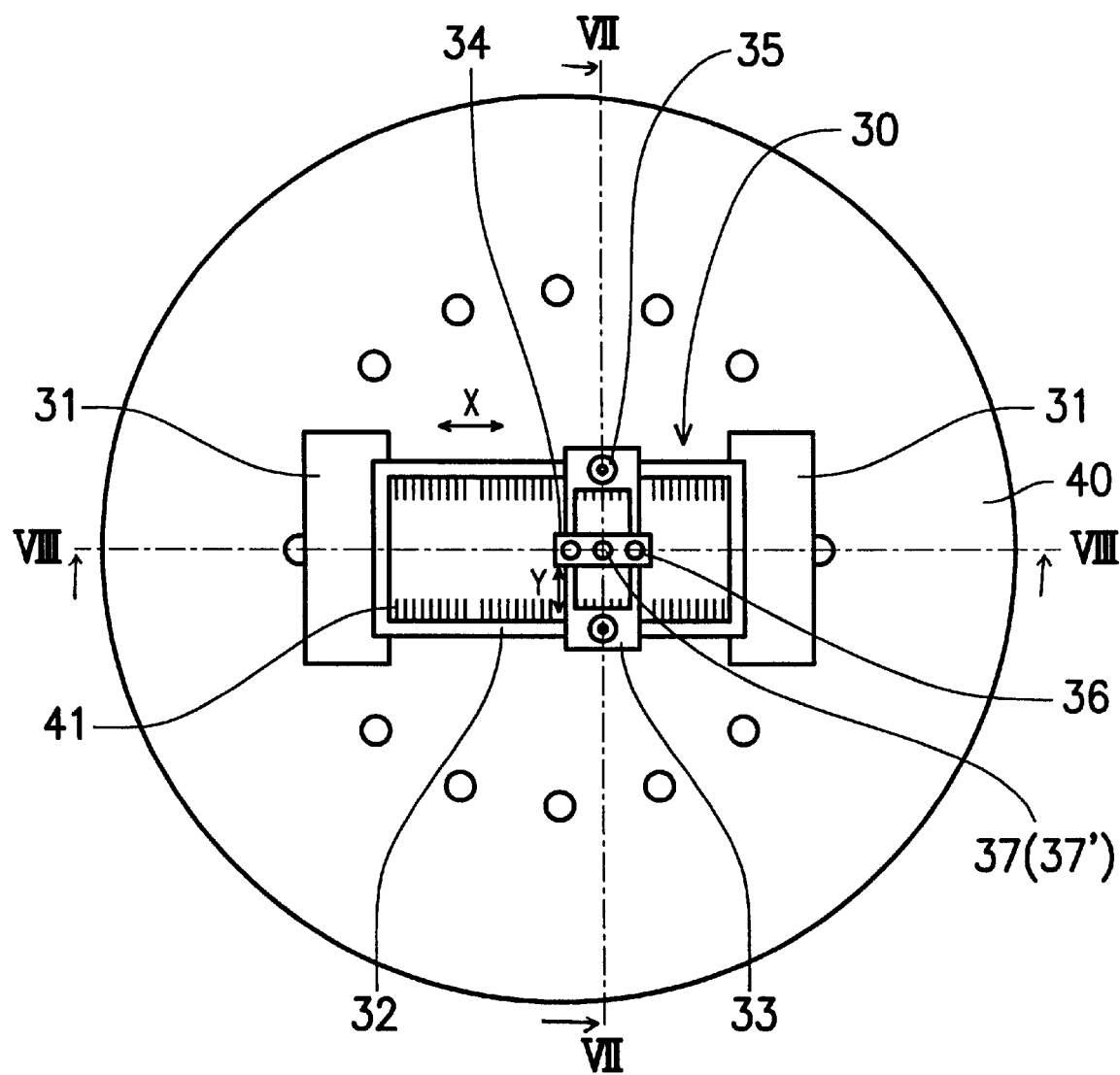
FIG. 4 is a top view of a probecard on which a probepin-adjusting jig of this invention is disposed.
Figure 5:
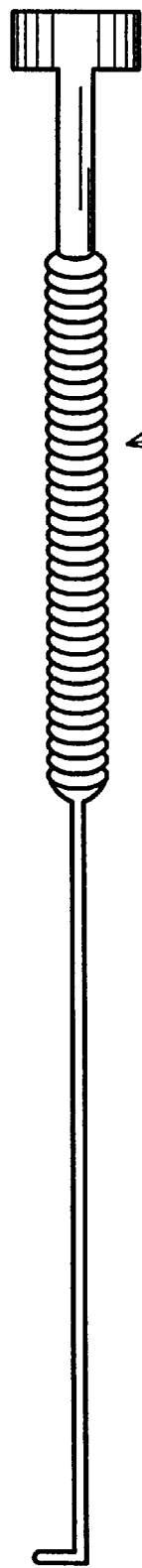
FIG. 5 is a schematic diagram of a hooking needle of this invention.
Figure 6:
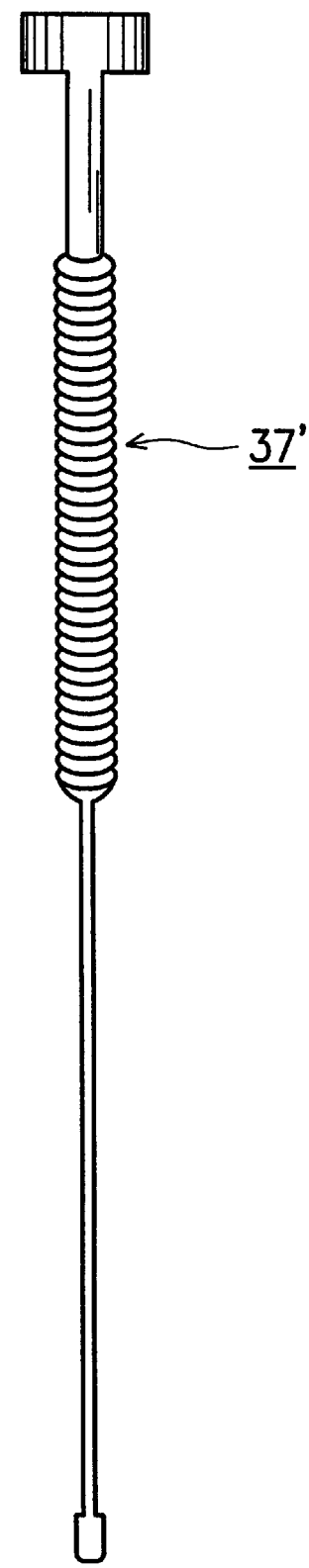
FIG. 6 is a schematic diagram of a pushing needle of this invention.

Referring to FIG. 4, a probepin-adjusting jig 30 of this invention is disposed on a probecard 40 to adjust the probepins 41 thereof. The probepin-adjusting jig 30 includes two supports 31, a main frame 32, a first slider 33, a second slider 34 and a needle 37 (or 37'). Reference number 37 denotes a hooking needle (FIG. 5), and reference number 37' denotes a pushing needle (FIG. 6). The respective needles 37, 37' are removable and used with the same jig to adjust the probepins of the probecard. Hereafter only the hooking needle 37 is utilized for the descriptions.

Figure 9:
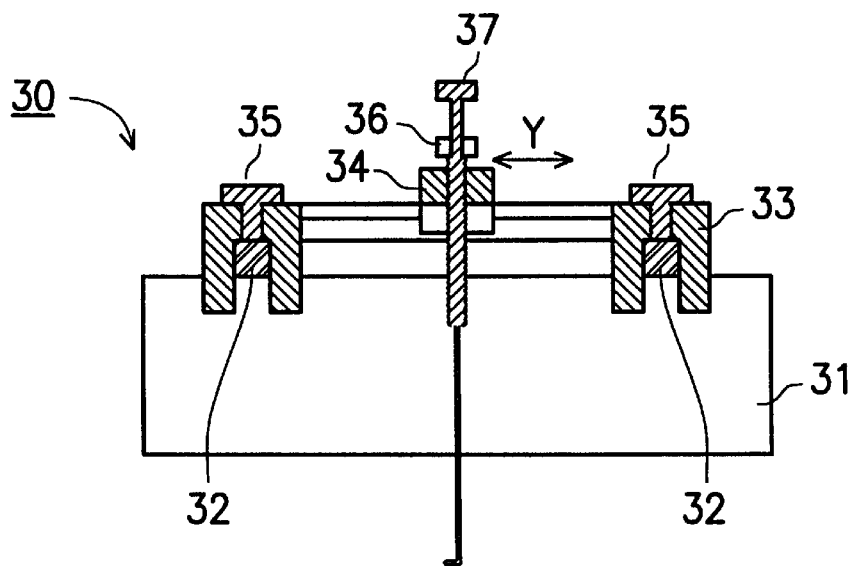
FIG. 9 is a sectional diagram of FIG. 4 along line VII—VII, after the sliders of the probepin-adjusting jig are positioned.
Figure 10:
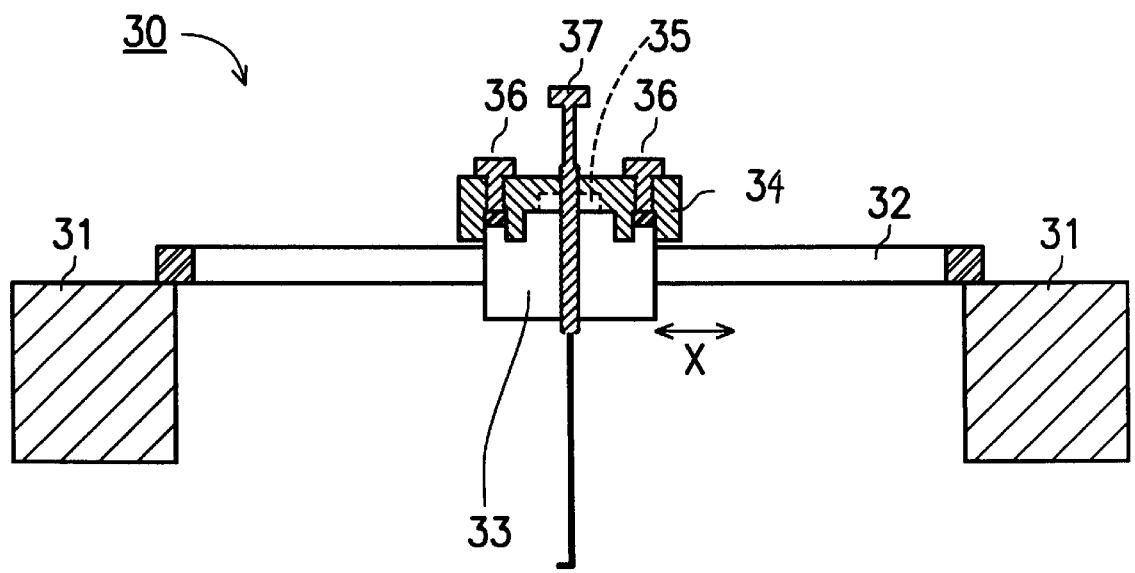
FIG. 10 is a sectional diagram of FIG. 4 along line VIII—VIII, after the sliders of the probepin-adjusting jig are positioned.

The main frame 32 is firmly connected to and supported by the supports 31. Also referring to FIGS. 7 and 8, the first slider 33 slidably sits on the main frame 32 to move in an X-direction, while the second slider 34 slidably sits on the first slider 33 to move in a Y-direction. In this embodiment, the X-direction is perpendicular to the Y-direction. The needle 37 is provided on the second slider 34 and can be therefore moved to any point in the XY-plane so as to adjust the probepins 41. Two positioning screws 35 are provided at two ends of the first slider 33. As shown in FIG. 9, the first slider 33 can be positioned at a desired position in the X-direction by twisting and thus lowering the screws 35 to the main frame 32. The screws 35 are forced against the main frame 32. Similarly, two positioning screws 36 are provided at two ends of the second slider 34. As shown in FIG. 10, the second slider 34 can be positioned at a desired position in the Y-direction by twisting as well as lowering the screws 36 to the first slider 33.

The shank of the needle 37 is threaded so that the needle can be threaded in the second slider 34. After the first and second sliders 33, 34 are moved to the desired position in the XY-plane, the needle is twisted and therefore lowered or raised to adjust the probepins 41 of the probecard 40.

The probepin-adjusting jig of this invention can prevent the technicians from disrupting the adjustment of the probepin through involuntary shaking of the hands, and therefore provides a simple, accurate probepin adjustment.

Although this invention has been described in its preferred forms and various examples with a certain degree of particularity, it is understood that the present disclosure of the preferred forms and the various examples can be changed in the details of construction. The scope of the invention should be determined by the appended claims and not by the specific examples given herein.

What is claimed is:

1. A probepin-adjusting jig in combination with a probecard, said probepin-adjusting jig for adjusting probepins of the probecard, said probepin-adjusting jig comprising:

a base disposed on the probecard;

a first slider sitting on the base to move in a first direction;

a second slider sitting on the first slider to move in a second direction; and a needle movably mounted in the second slider to adjust the probepins of the probecard, said needle extending through said base and said first slider to contact the probepins.

2. A probepin-adjusting jig as claimed in claim 1, wherein the first direction is perpendicular to the second direction.

3. A probepin-adjusting jig as claimed in claim 1, wherein the needle is threaded in the second slider so that the needle can be twisted to touch and adjust the probepins of the probecard.

4. A probepin-adjusting jig as claimed in claim 3, wherein the needle is a hooking needle.

5. A probepin-adjusting jig as claimed in claim 3, wherein the needle is a pushing needle.

6. A probepin-adjusting jig as claimed in claim 1, further comprising first positioning means mounted in the first slider to position the first slider on the base after the first slider is moved to a first desired position.

7. A probepin-adjusting jig as claimed in claim 6, wherein the first positioning means are screws which are twisted and forced against the base to position the first slider.

8. A probepin-adjusting jig as claimed in claim 1, further comprising second positioning means mounted in the second slider to position the second slider on the first slider after the second slider is moved to a second desired position.

9. A probepin-adjusting jig as claimed in claim 8, wherein the second positioning means are screws which are twisted and forced against the first slider to position the second slider.

* * * * *